US009915968B2

(12) United States Patent
Jain et al.

(10) Patent No.: US 9,915,968 B2
(45) Date of Patent: Mar. 13, 2018

(54) SYSTEMS AND METHODS FOR ADAPTIVE CLOCK DESIGN

(71) Applicant: QUALCOMM Incorporated, San Diego, CA (US)

(72) Inventors: Palkesh Jain, Bangalore (IN); Virendra Bansal, Bangalore (IN); Manoj Mehrotra, Bangalore (IN); Keith Alan Bowman, Morrisville, NC (US)

(73) Assignee: QUALCOMM Incorporated, San Diego, CA (US)

( * ) Notice: Subject to any disclaimer, the term of this patent is extended or adjusted under 35 U.S.C. 154(b) by 12 days.

(21) Appl. No.: 15/133,068

(22) Filed: Apr. 19, 2016

(65) Prior Publication Data
US 2017/0300080 A1    Oct. 19, 2017

(51) Int. Cl.
| G06F 1/04 | (2006.01) |
| G06F 1/26 | (2006.01) |
| H03K 3/03 | (2006.01) |
| H03L 7/06 | (2006.01) |

(52) U.S. Cl.
CPC .............. G06F 1/04 (2013.01); G06F 1/26 (2013.01); H03K 3/0315 (2013.01); H03L 7/06 (2013.01)

(58) Field of Classification Search
CPC ........... G06F 1/04; G06F 1/26; H03K 3/0315; H03L 7/06
See application file for complete search history.

(56) References Cited

U.S. PATENT DOCUMENTS

| 5,666,387 A * | 9/1997 | Tamamura ........... H03K 3/0231 331/25 |
| 6,509,788 B2 | 1/2003 | Naffziger et al. |
| 6,762,629 B2 | 7/2004 | Tam et al. |
| 7,148,755 B2 | 12/2006 | Naffziger et al. |
| 2002/0130695 A1* | 9/2002 | Jesephson ................. G06F 1/04 327/291 |
| 2004/0183613 A1 | 9/2004 | Kurd et al. |
| 2008/0204158 A1* | 8/2008 | Weder .................. H03K 3/0315 331/177 V |
| 2014/0254734 A1 | 9/2014 | Abdelmoneum et al. |

OTHER PUBLICATIONS

Cortadella J., et al., "Adaptive Clock with Useful Jitter," 2015, 7 pages.

(Continued)

*Primary Examiner* — Stefan Stoynov

(57) ABSTRACT

The present disclosure is directed to mitigating voltage droops. An aspect includes outputting, by a clock module coupled to a multiplexor, a first clock signal to the multiplexor, the first clock signal generated by a clock delay component of the clock module, receiving, by the clock module, a second clock signal from a phase-locked loop (PLL), wherein the PLL outputs a third clock signal to a processor coupled to the PLL and the multiplexor, selecting, by the multiplexor, the first clock signal to output to the processor based on detecting a droop in voltage on a power supply, and selecting, by the multiplexor, the third clock signal to output to the processor based on detecting that the droop in the voltage on the power supply has passed, wherein the clock module and the processor are coupled to the power supply.

28 Claims, 10 Drawing Sheets

(56) References Cited

OTHER PUBLICATIONS

Bowman K.A., et al., "A 16 nm All-Digital Auto-Calibrating Adaptive Clock Distribution for Supply Voltage Droop Tolerance Across a Wide Operating Range", IEEE Journal of Solid-State Circuits, Jan. 2016, vol. 51, No. 1, pp. 3-17.
International Search Report and Written Opinion—PCT/US2017/027121—ISA/EPO—dated Jul. 13, 2017.

\* cited by examiner

SYSTEMS AND METHODS FOR ADAPTIVE CLOCK DESIGN

INTRODUCTION

The present disclosure is related to systems and methods for adaptive clock design, and more particularly, to systems and methods for mitigating the effect of voltage droops on a processor.

High-frequency supply voltage (VDD) droops degrade the performance and energy efficiency of a processor. Such droops result from an abrupt change in processor switching activity (e.g., coming IN and OUT of power managed states), which induces large current transients in the power delivery system and affects circuits globally across the die. VDD droops may occur with frequencies ranging in delay from a few nanoseconds (i.e., high frequency) to a few microseconds (i.e., low frequency). High frequency (approximately 100 MHz) droops force a reduction in the maximum frequency ($F_{max}$) of the processor, or require minimum voltage guardbands (i.e., margins) of approximately 100 mV.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

A method of mitigating voltage droops includes outputting, by a clock module coupled to a multiplexor, a first clock signal to the multiplexor, the first clock signal generated by a clock delay component of the clock module, receiving, by the clock module, a second clock signal from a phase-locked loop (PLL), wherein the PLL outputs a third clock signal to a processor coupled to the PLL and the multiplexor, selecting, by the multiplexor, the first clock signal to output to the processor based on detecting a first droop in voltage on a first power supply, and selecting, by the multiplexor, the third clock signal to output to the processor based on detecting that the first droop in the voltage on the first power supply has passed, wherein the clock module and the processor are coupled to the first power supply.

An apparatus for mitigating voltage droops includes a processor coupled to a first power supply, a multiplexor coupled to the processor, a clock module coupled to the multiplexor and the first power supply, wherein the clock module includes a clock delay component, and a PLL coupled to the multiplexor, wherein the clock module outputs a first clock signal to the multiplexor and receives a second clock signal from the PLL, the first clock signal generated by the clock delay component, wherein the multiplexor is configured to select the first clock signal from the clock module or a third clock signal from the PLL to output to the processor, and wherein, based on detection of a first droop in voltage on the first power supply, the multiplexor selects the first clock signal from the clock module to output to the processor.

An apparatus for mitigating voltage droops includes a processor means coupled to a first power supply means, a multiplexor means coupled to the processor means, a clock means coupled to the multiplexor means and the first power supply means, wherein the clock means includes a clock delay component, and a PLL coupled to the multiplexor means, wherein the clock means outputs a first clock signal to the multiplexor means and receives a second clock signal from the PLL, the first clock signal generated by the clock delay component, wherein the multiplexor means is configured to select the first clock signal from the clock means or a third clock signal from the PLL to output to the processor means, and wherein, based on detection of a first droop in voltage on the first power supply means, the multiplexor means selects the first clock signal from the clock means to output to the processor means.

A non-transitory computer-readable medium for mitigating voltage droops includes at least one instruction to output, by a clock module coupled to a multiplexor, a first clock signal to the multiplexor, the first clock signal generated by a clock delay component of the clock module, at least one instruction to receive, by the clock module, a second clock signal from a PLL, wherein the PLL outputs a third clock signal to a processor coupled to the PLL and the multiplexor, at least one instruction to select, by the multiplexor, the first clock signal to output to the processor based on detecting a first droop in voltage on a first power supply, and at least one instruction to select, by the multiplexor, the third clock signal to output to the processor based on detection that the first droop in the voltage on the first power supply has passed, wherein the clock module and the processor are coupled to the first power supply.

Other objects and advantages associated with the aspects and embodiments disclosed herein will be apparent to those skilled in the art based on the accompanying drawings and detailed description.

BRIEF DESCRIPTION OF THE DRAWINGS

A more complete appreciation of embodiments of the disclosure and many of the attendant advantages thereof will be readily obtained as the same becomes better understood by reference to the following detailed description when considered in connection with the accompanying drawings which are presented solely for illustration and not limitation of the disclosure, and in which.

DETAILED DESCRIPTION

Figure 1:
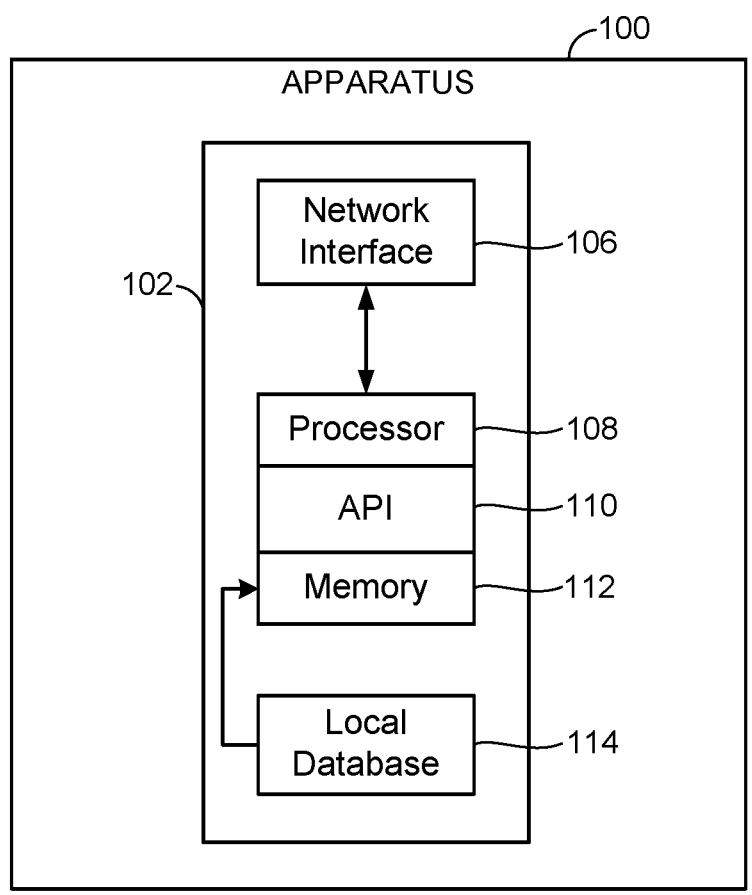
FIG. 1 illustrates an example apparatus in accordance with at least one embodiment of the disclosure.

The present disclosure is related to systems and methods for adaptive clock design, and more particularly, to systems and methods for mitigating the effect of voltage droops on a processor. An aspect includes outputting, by a clock module coupled to a multiplexor, a first clock signal to the multiplexor, the first clock signal generated by a clock delay component of the clock module, receiving, by the clock module, a second clock signal from a phase-locked loop (PLL), wherein the PLL outputs a third clock signal to a processor coupled to the PLL and the multiplexor, selecting, by the multiplexor, the first clock signal to output to the processor based on detecting a droop in voltage on a power supply, and selecting, by the multiplexor, the third clock signal to output to the processor based on detecting that the droop in the voltage on the power supply has passed, wherein the clock module and the processor are coupled to the power supply.

These and other aspects of the disclosure are disclosed in the following description and related drawings directed to specific embodiments of the disclosure. Alternate embodiments may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any embodiment described herein as "exemplary" and/or "example" is not necessarily to be construed as preferred or advantageous over other embodiments. Likewise, the term "embodiments of the disclosure" does not require that all embodiments of the disclosure include the discussed feature, advantage, or mode of operation.

Further, various embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequences of actions described herein can be considered to be embodied entirely within any form of computer-readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Table 1 is a glossary of acronyms used in the present disclosure.

TABLE 1

Glossary

| Acronym | Definition |
|---|---|
| ACD | Adaptive Clock Distribution |
| FCLK | Clock frequency |
| PDN | Power Delivery Network |
| PLL | Phase-Locked Loop |
| RO | Ring Oscillator |
| VDD | High-frequency supply voltage |
| VDDFX | Voltage Frequency |
| VTCLK | Clock |

FIG. 1 illustrates an example apparatus 100 in accordance with at least one embodiment of the disclosure. The apparatus 100 may correspond to any device having a processor and a memory and being capable of communicating with other devices. Examples of the apparatus 100 include, but are not limited to, a user device (e.g., a cell phone, smartphone, laptop computer, desktop computer, tablet computer, personal digital assistant (PDA), etc.)), an access point (e.g., cellular base station, WiFi access point, Bluetooth® access point, etc.), a server device, and the like.

While internal components of such devices can be embodied with different hardware configurations, a basic high-level configuration for internal hardware components is shown as platform 102 in FIG. 1. The platform 102 can include a network interface 106 coupled to a processor 108, or other microprocessor, logic circuit, or other data processing device. The network interface 106 may be a wired network interface (e.g., network access ports) or a wireless network interface (e.g., a transmitter and receiver or a transceiver). The network interface 106 can receive software applications, data, and/or commands transmitted from other devices across a wired or wireless network.

The processor 108 executes an application programming interface (API) 110 that interfaces with any resident programs in a memory 112. The memory 112 can be comprised of read-only or random-access memory (ROM or RAM), electrically erasable programmable ROM (EEPROM), flash cards, or any memory common to computer platforms. The platform 102 can also include a local database 114 that can store applications not actively used in the memory 112, as well as other data. The local database 114 is typically a flash memory cell, but can be any secondary storage device as known in the art, such as magnetic media, EEPROM, optical media, tape, soft or hard disk, or the like.

Accordingly, an embodiment of the disclosure can include an apparatus (e.g., apparatus 100) including the ability to perform the functions described herein. As will be appreciated by those skilled in the art, the various logic elements can be embodied in discrete elements, software modules executed on a processor, or any combination of software and hardware to achieve the functionality disclosed herein. For example, the processor 108, memory 112, API 110, and the local database 114 may all be used cooperatively to load, store and execute the various functions disclosed herein, and thus the logic to perform these functions may be distributed over various elements. Alternatively, the functionality could be incorporated into one discrete component. Therefore, the features of the apparatus 100 are to be considered merely illustrative and the disclosure is not limited to the illustrated features or arrangement.

High-frequency supply voltage (VDD) droops degrade the performance and energy efficiency of a processor, such as the processor 108. Such droops result from an abrupt change in processor switching activity (e.g., coming IN and OUT of power-managed states), which induces large current transients in the power delivery system and affects circuits globally across the die. VDD droops may occur with frequencies ranging in delay from a few nanoseconds (i.e., high frequency) to a few microseconds (i.e., low frequency). High frequency (approximately 100 MHz) droops force a reduction in the maximum frequency ($F_{max}$) of the processor, or require minimum voltage ($V_{min}$—the minimum operating voltage for a given frequency condition) guardbands (i.e., margins) of approximately 100 mV.

Figure 2:
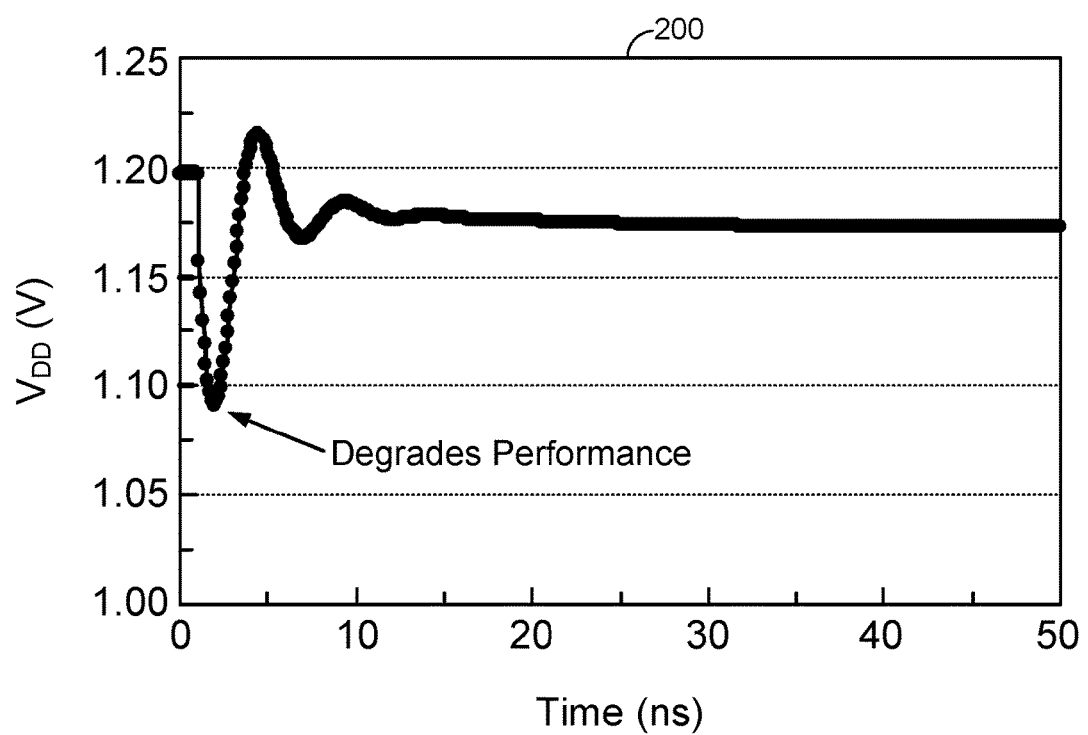
FIG. 2 is a graph illustrating an exemplary voltage droop.

FIG. 2 is a graph 200 illustrating an exemplary VDD droop. As can be seen in FIG. 2, the VDD droops approximately 100 mV, and therefore requires a $V_{min}$ guardband of at least 100 mV.

To address VDD droops, conventional processor designs build-in one or more of the following:
 a. Clock frequency (FCLK) margins, whereby the clock slows down to wait for the droop to pass,
 b. VDD guardbands (e.g., 100 mV), and/or
 c. Costly decaps (on the die, package, or board).
These measures ensure correct functionality in the presence of worst-case droops, but introduce a significant cost in terms of power or the die area.

However, such droops rarely occur, and implementing inflexible guardbands for such infrequent droops severely limits the performance and energy efficiency of the processor, while also hindering it from lowering its energy use or increasing $F_{max}$ in favorable conditions. For example, in some cases, where voltage margins run into the 100 mV+ range, this represents almost 20% wasted power.

Certain conventional approaches to mitigate the effects of VDD droops implement various self-adaptive techniques. One technique includes droop detection and clock frequency reduction, whereby a droop is detected and responded to if the droop exceeds a certain threshold (e.g., 30 mV). However, this technique suffers from a response time limitation, as there is a delay between the time the droop is detected and the time it is responded to. Another technique implements an adaptive phase-locked loop (PLL), whereby the PLL is slowed down once the droop sets in. However, this technique suffers from design complexity. Yet another technique uses Adaptive Clock Distribution (ACD), which eliminates the response time limitation, but introduces throughput tradeoffs due to the F/2 operation (i.e., dividing the frequency of the clock in half).

Accordingly, the present disclosure provides a mechanism whereby the clock, continuously and instantaneously, responds to the variations in the supply voltage, thus inherently having built-in margins.

Figure 3:
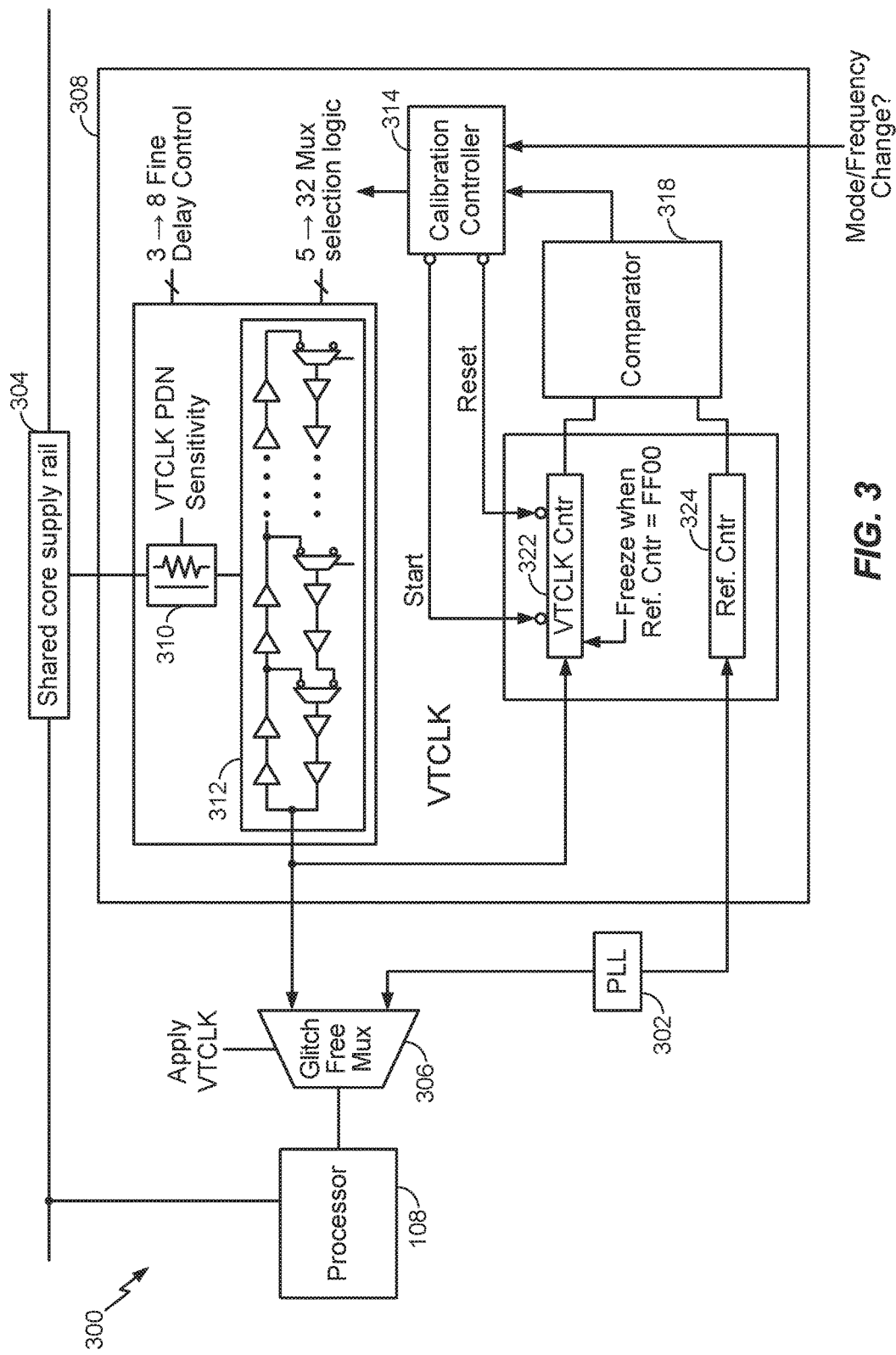
FIG. 3 illustrates an exemplary architecture according to at least one embodiment of the disclosure.

FIG. 3 illustrates an exemplary architecture 300 according to at least one embodiment of the disclosure. In conventional circuits, a clock signal is typically delivered to the processor 108 from a PLL 302. However, the PLL 302 and the processor 108 are on different power supplies, and thus, by the time a voltage droop is detected and mitigated (e.g., by slowing down the clock 308), much of the damage has been done.

Accordingly, the present disclosure adds a power supply coupled ring oscillator (RO) 312 to the clock 308. The RO 312, via a VTCLK power delivery network (PDN) 310, sees the same power as the processor 108, as both are connected to a shared core supply rail 304, and therefore, see the same voltage droops. A glitch-free multiplexor 306 selects either the clock signal from the PLL 302 (on the separate power supply) or, when there is a voltage droop, the output signal from the RO 312. More specifically, upon detecting a droop on the shared core supply rail 304, the glitch-free multiplexor 306 selects the output signal from the RO 312. The RO 312 causes the clock 308 to instantaneously slow down the frequency of the clock 308 until the droop passes, at which time, the glitch-free multiplexor 306 switches back to the PLL clock signal. In this way, the clock 308 can continuously and instantaneously respond to the variations in supply voltage to the processor 108 on the shared core supply rail 304.

As described in more detail below, the frequency of the RO 312 should be calibrated to the frequency of the PLL 302. The calibration may be performed in real time, at periodic intervals, or upon various trigger conditions. For example, as will be appreciated, the frequencies of the RO 312 and the PLL 302 may become uncalibrated during a droop event, but then should be recalibrated when the droop passes.

Still referring to FIG. 3, the architecture 300 also includes a VTCLK counter 322, a reference counter 324, a comparator 318, and a calibration controller 314, the operation of which will be described further below with reference to FIG. 7.

Figure 4:
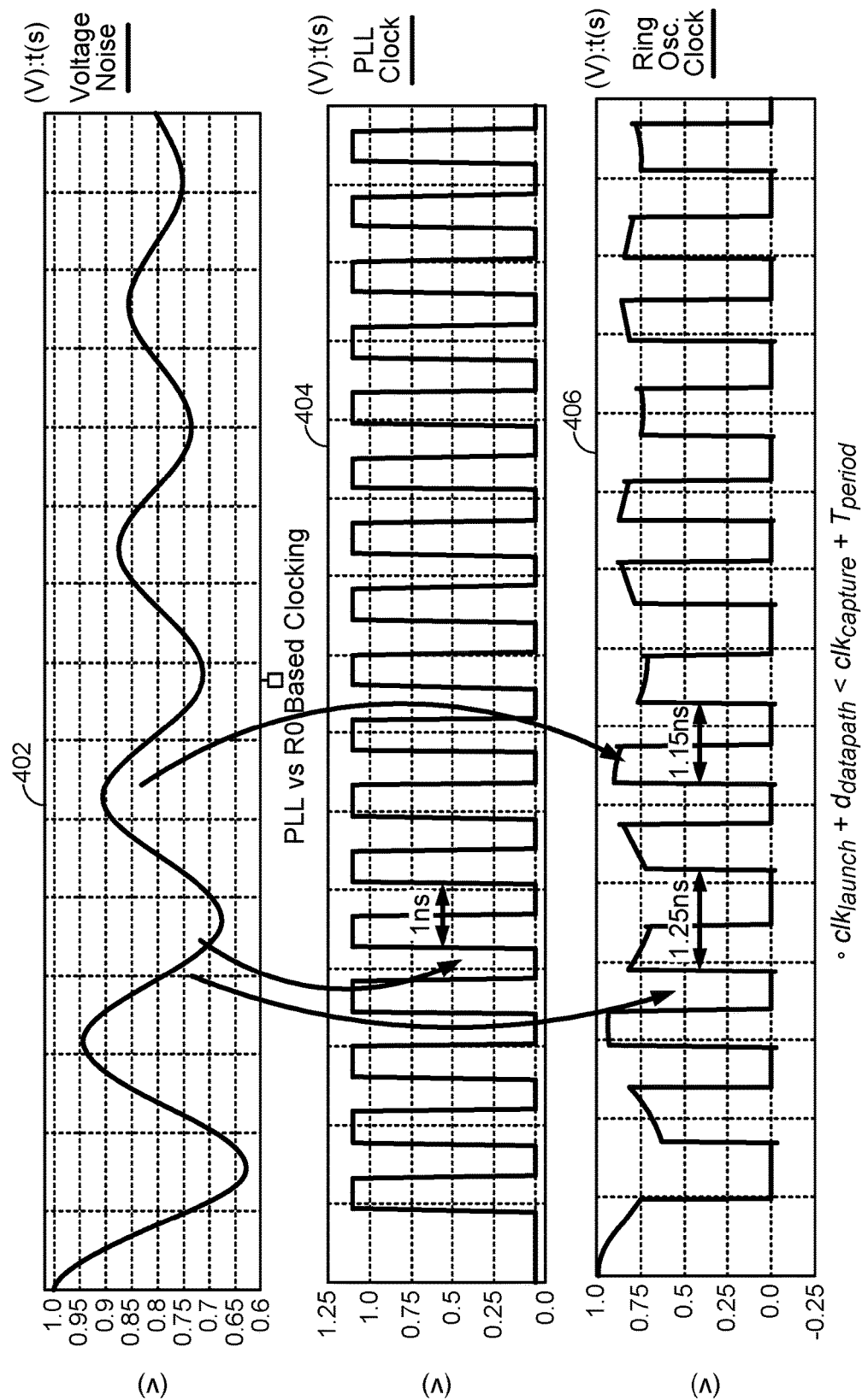
FIG. 4 illustrates exemplary graphs showing the difference between a phase-locked loop (PLL)-based clock signal and a ring oscillator (RO)-based clock signal.

FIG. 4 illustrates exemplary graphs showing the difference between the PLL-based clock signal and the RO-based clock signal. Specifically, graph 402 shows the changes in voltage on the shared core supply rail 304 (Y-axis) over time (X-axis). Graph 404 shows the voltage of the PLL clock signal (Y-axis) over time (X-axis). Graph 406 shows the voltage of the RO clock signal (Y-axis) over time (X-axis). As can be seen, the PLL clock signal does not change over time with the change in voltage of the shared core supply rail 304. However, the RO clock signal does change with the change in voltage of the shared core supply rail 304. Further, the RO-based clocking scheme tracks the datapath-degradation very closely; it stretches when droop events occur, and it can also speed-up when the voltage moves upwards.

The architecture of the present disclosure may operate in various modes and frequency combinations, which may require high-accuracy (e.g., approximately 1 ps) and real-time self-calibration capability (rather than one-time) from the RO-based clocking. In addition, the software applications should be able to instruct the RO 312 to change its frequency in arbitrary steps. Further, the transitions within the RO 312 should be glitch free. Finally, the placement of the RO 312 may be influenced by the noise-response.

Figure 5:
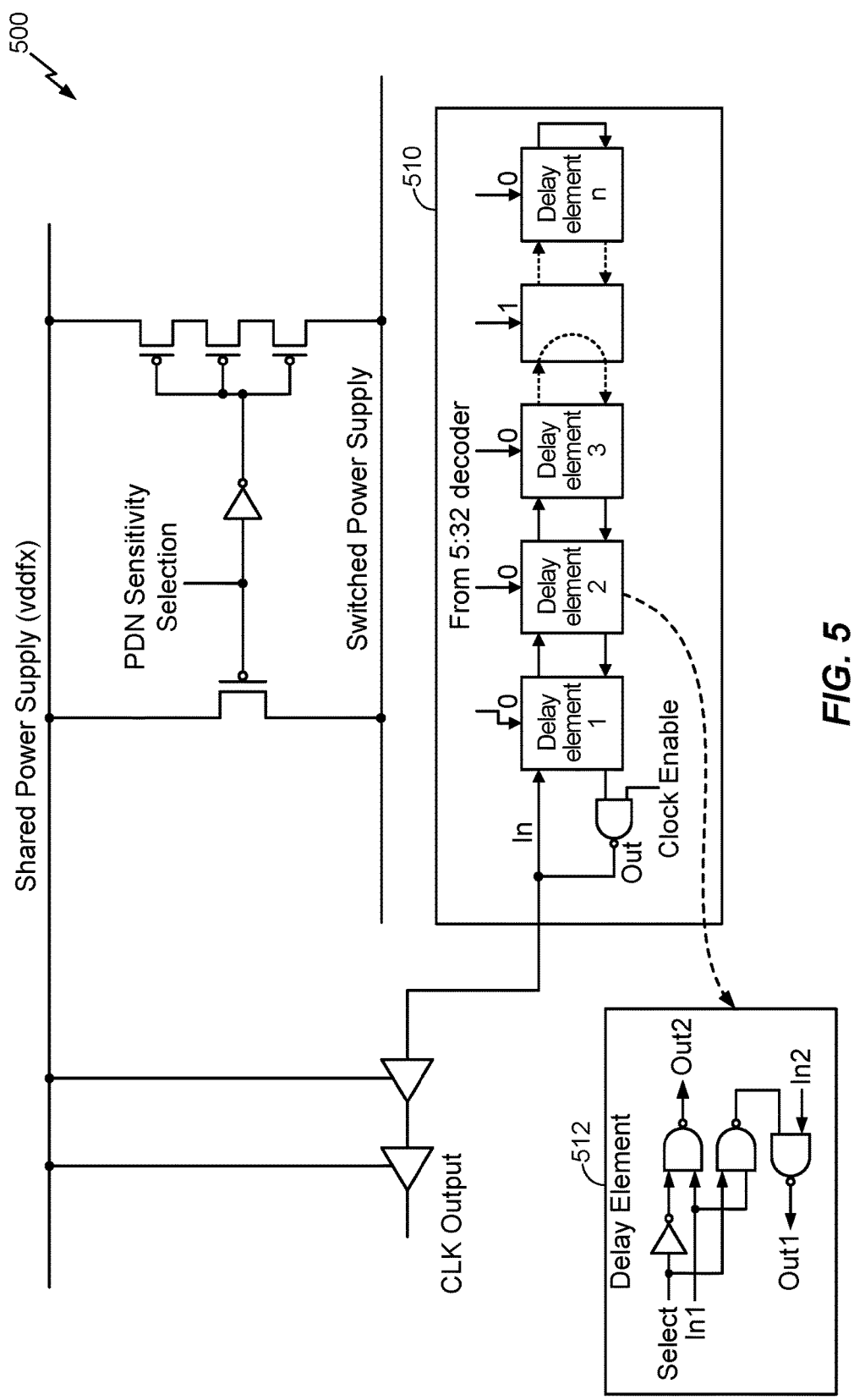
FIG. 5 illustrates an example architecture of the RO in FIG. 3 that provides coarse auto-calibration with the PLL according to at least one embodiment of the disclosure.

FIG. 5 illustrates an example architecture 500 of the RO 312 in FIG. 3 that provides coarse auto-calibration with the PLL 302 according to at least one embodiment of the disclosure. The architecture 500 includes a plurality of delay elements 510. A detailed view of a delay element is referred to by reference number 512. The first 12 delay elements of the delay elements 510 (not all of which are shown in FIG. 5) have their select inputs tied to the shared power supply, or VDDFX (the voltage frequency), and are connected in a feedthrough manner. The remaining 32 delay elements of the delay elements 510 (not all of which are shown in FIG. 5) have respective select inputs. As shown in FIG. 5, these select inputs determine the number of delay element hops by which to delay the input signal.

In the example of FIG. 5, three delay elements of the delay elements 510 are selected. Each delay element 512 of the delay elements 510 adds a substantially identical delay per coarse-state hop (there may be process variations). Further, the delay is increased or decreased monotonically based on settings.

In addition, there is also a control that can change the sensitivity to the voltage. Specifically, this is accomplished by the PDN Sensitivity Selection pin.

Figure 6:
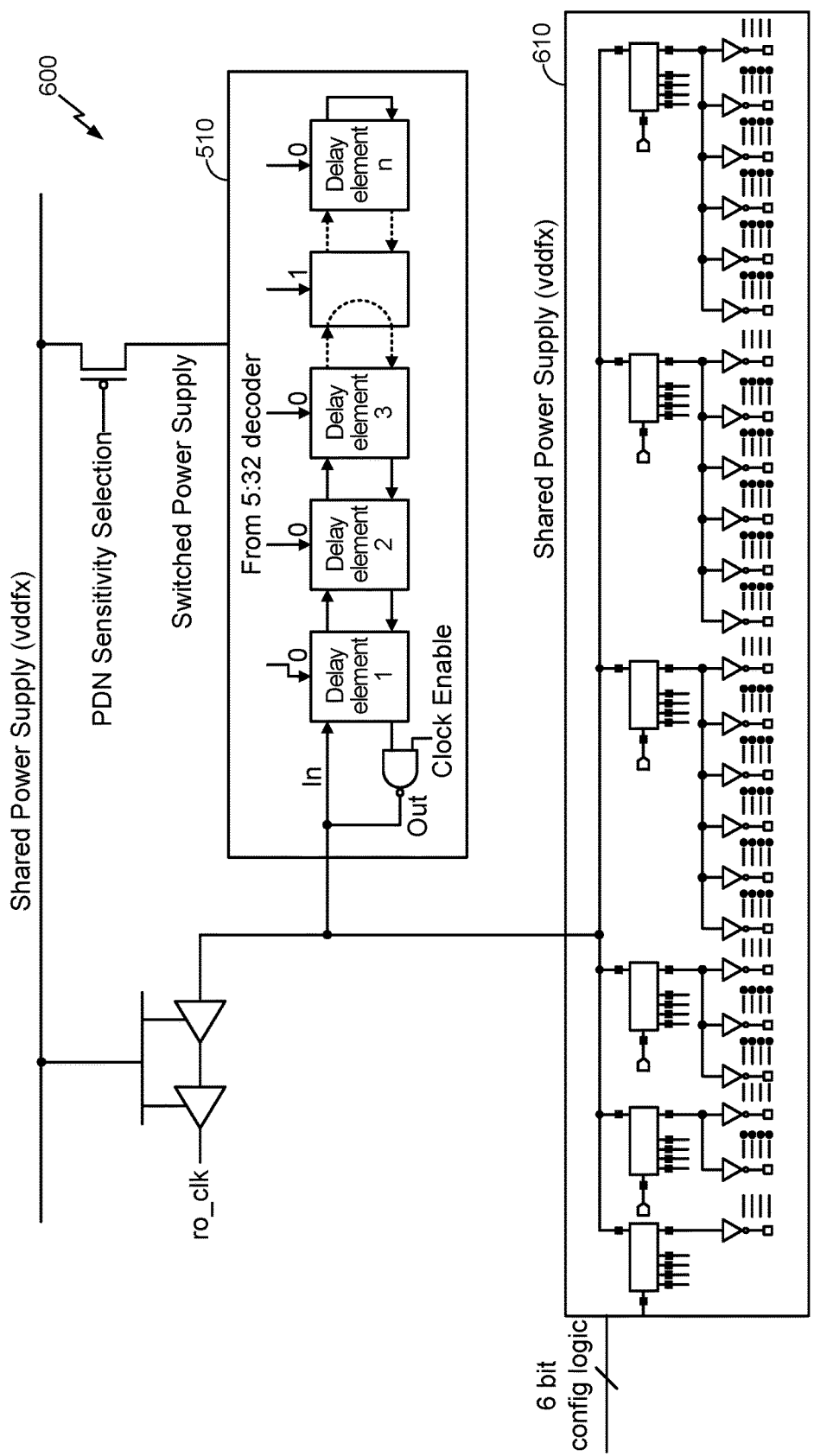
FIG. 6 illustrates an example architecture of the RO in FIG. 3 that provides finer auto-calibration with the PLL according to at least one embodiment of the disclosure.

FIG. 6 illustrates an example architecture 600 of the RO 312 in FIG. 3 that provides finer auto-calibration with the PLL 302 according to at least one embodiment of the disclosure. In the architecture 600, an additional sub-architecture 610 is added to the architecture 500 in FIG. 5 to provide finer auto-calibration with the PLL 302. Finer delay calibration is used for reducing the error between the PLL frequency and the delay line frequency. Upon coarse frequency adjustment, the delay line will be left with about 10-15 ps inaccuracy. Using the finer delay calibration, as shown in FIG. 6, the coarse inaccuracy is taken forward and the error is reduces to 1-2 ps. This is achieved by adjusting the load on just one net in the circuit. This load could be the load of a single gate or multiple gates, for example.

Figure 7:
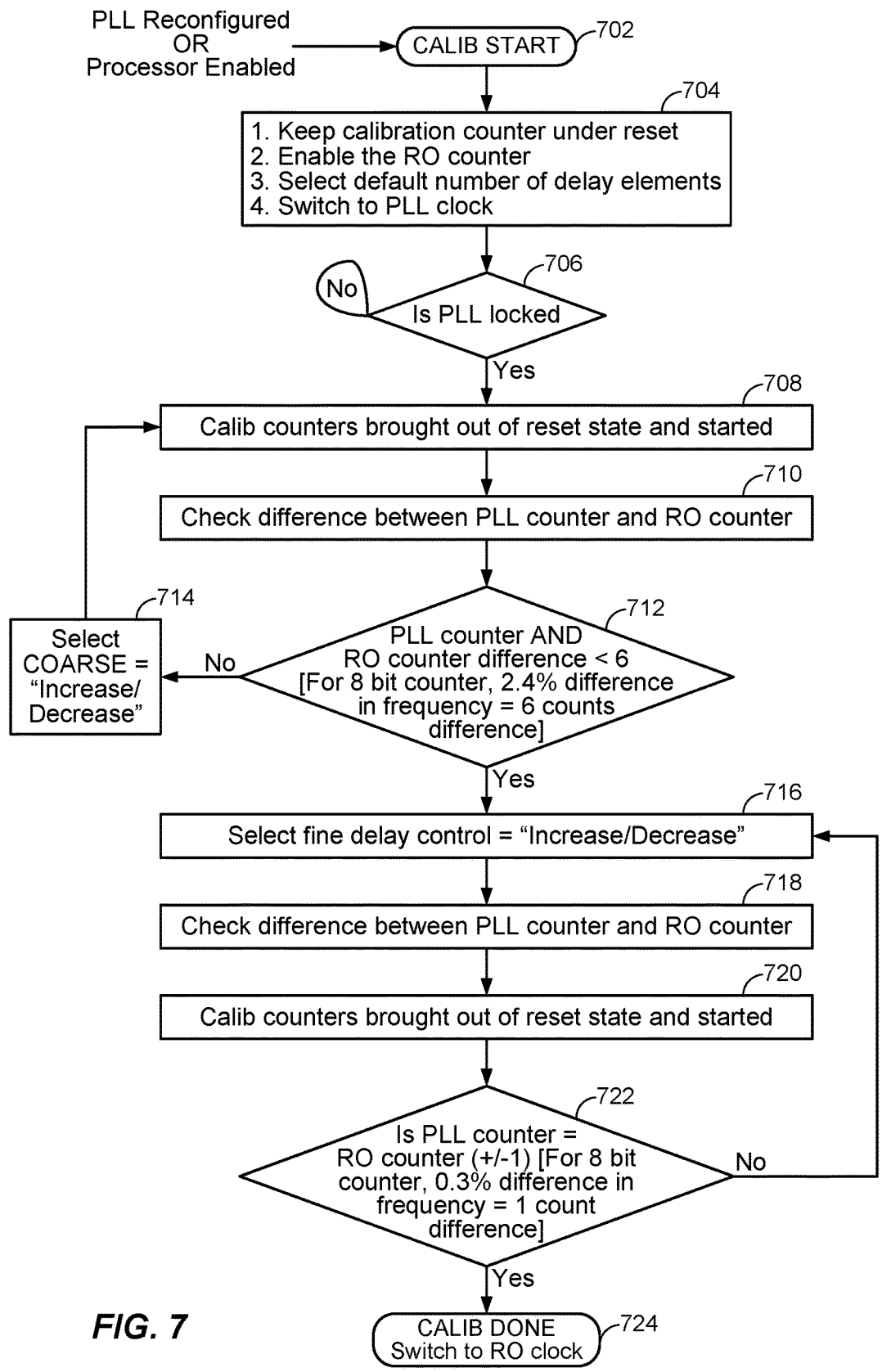
FIG. 7 illustrates an exemplary flow for auto-calibrating the RO with the PLL according to at least one embodiment of the disclosure.

FIG. 7 illustrates an exemplary flow for auto-calibrating the RO 312 with the PLL 302 according to at least one embodiment of the disclosure. The flow illustrated in FIG. 7 may be performed by the architecture 300 in FIG. 3, the architecture 500 in FIG. 5, and/or the architecture 600 in FIG. 6.

At 702, calibration begins based on the PLL 302 being reconfigured or the processor 108 being enabled, for example. At 704, the architecture 300/500/600, for example the calibration controller 314, puts a calibration counter in a reset state, enables the digital counters (the VTCLK counter 322 and the reference counter 324 of FIG. 3), selects a default number of delay elements of the delay elements 510, and switches to the clock signal from the PLL 302. At 706, the architecture 300/500/600 determines whether the PLL 302 is locked. If the PLL 302 is not locked, the flow waits until it is.

If, however, the PLL 302 is locked, then at 708, the calibration counter is brought out of the reset state and started. At 710, the architecture 300/500/600, for example the comparator 318, determines the difference between the VTCLK counter 322 and the reference counter 324. At 712, the architecture 300/500/600, for example the calibration controller 314 using the result from the comparator 318, determines whether the difference between the VTCLK counter 322 and the reference counter 324 is less than a threshold (e.g., 6, because for an 8-bit counter, a 2.4% difference in frequency equals a six count difference).

At 714, if the difference between the VTCLK counter 322 and the reference counter 324 is not less than the threshold, then the architecture 300/500/600 selects COARSE delay control equal to "increase/decrease," and the flow returns to 708. However, at 716, if the difference between the VTCLK counter 322 and the reference counter 324 is less than the threshold, then the architecture 300/500/600 selects FINE delay control equal to "increase/decrease." Note that VTCLK (or RO) calibration is done in two steps. The first step is coarse calibration and the second step is fine calibration. For coarse delay adjustments, the number of stages is altered, and for the fine delay, the exact loading for one of the stages is altered.

At 718, the architecture 300/500/600, for example comparator 318, again determines the difference between the VTCLK counter 322 and the reference counter 324. At 720, the calibration counters are brought out of the reset state and started. Note that the calibration counters are brought out of the reset state and started twice. The first time is for coarse delay and the second time for the fine delay.

At 722, the architecture 300/500/600 determines whether or not the VTCLK counter 322 is equal to the value of the reference counter 324, plus or minus some amount (e.g., 1, because for an 8-bit counter, a 0.3% difference in frequency equals one count difference). At 724, the calibration is complete, and the architecture 300/500/600 switches to the RO-based clock signal.

There are a number of advantages to the architecture disclosed herein. For example, the architecture is non-intrusive, insofar as there are only minimal changes required. The exact design process, the targets, and the closure continue to occur with the PLL 302. Post-silicon, $V_{min}$ can be established with the PLL-based approach and subsequently with the RO-based approach.

Figure 8:
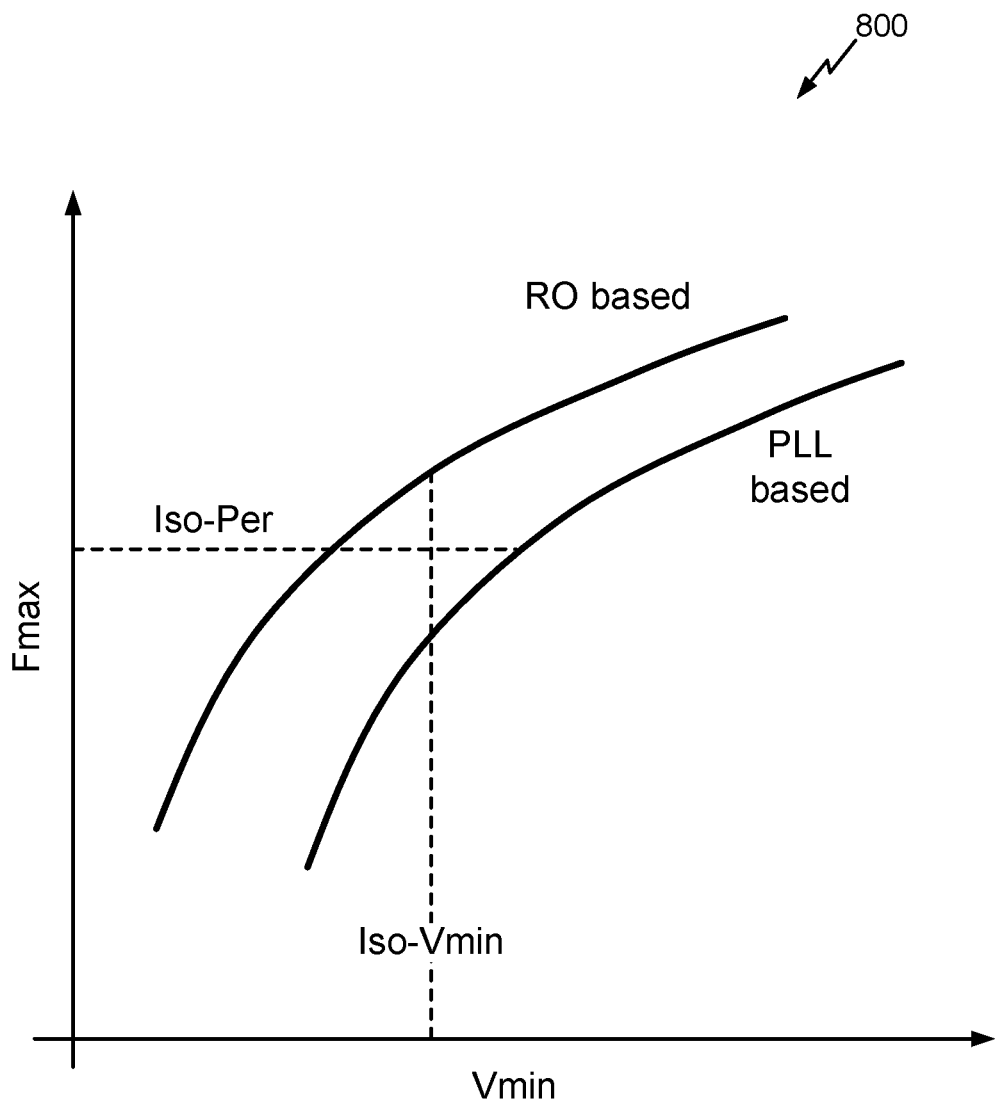
FIG. 8 illustrates an example graph showing the advantage of the RO-based clock in contrast to the typical PLL-based clock.

The proposed architecture also provides a reduction of voltage drop margins in the range of, for example, approximately 50 mV to 100 mV, which allows for $V_{min}$ relaxation and faster design-closure. FIG. 8 illustrates an example graph 800 showing the advantage of the RO-based clock in contrast to the typical PLL-based clock. Further, automatic calibration to the desired frequency maximizes the benefit of the adaptive design to enhance performance and energy. Finally, any integrated circuit (IC) with the adaptive clock distribution can use the proposed architecture.

It should be noted that the power supply noises (i.e., voltage droops) may be due to various reasons and may be in different frequency spectrums. Thus, it may not be beneficial for the clock to respond to all noises. Accordingly, the present disclosure allows for the power supply for the clock generator to be coupled with the appropriate configurable filters to bypass noises in unwanted frequency regimes.

Figure 9:
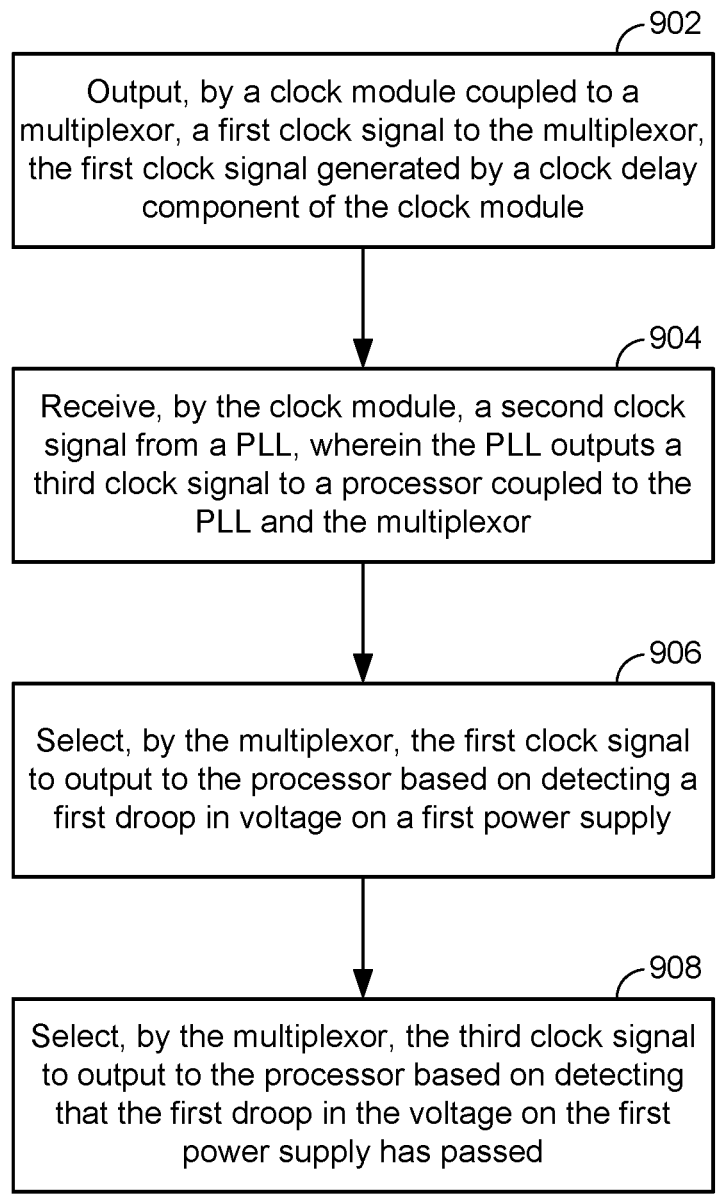
FIG. 9 illustrates an exemplary flow for mitigating voltage droops according to at least one embodiment of the disclosure.

FIG. 9 illustrates an exemplary flow for mitigating voltage droops according to at least one embodiment of the disclosure.

At 902, a clock module (e.g., clock 308 in FIG. 3) coupled to a multiplexor (e.g., multiplexor 306 in FIG. 3) outputs a first clock signal to the multiplexor, the first clock signal generated by a clock delay component (e.g., RO 312 in FIG. 3) of the clock module. The clock delay component may slow down a frequency of the first clock signal in response to detection of the droop in the voltage on the first power supply.

In an embodiment, the clock delay component may include a plurality of delay elements, and each delay element of the plurality of delay elements, when selected, delays the first clock signal by a delay amount equal to the delay amount of each remaining delay element of the plurality of delay elements. A number of the plurality of delay elements may be selected based on the second clock signal from the PLL, and the second clock signal may be based on a user configuration.

User configuration refers to the configuration in which the user wants to run the operations on the chip. For example, the user running a 1080p camera encode operation would require a different frequency than a frequency of an internet browsing mode.

A delay of the clock delay component may be calibrated to a frequency of the PLL. The calibration may be performed in real time, at periodic intervals, upon one or more trigger conditions, based on a user triggering a mode change of a user device including the processor, or any combination thereof. The user triggering the mode change comprises the user switching a mode of operation of the user device from a first mode to a second mode, wherein the second mode utilizes a lower frequency of the processor than the first mode.

At 904, the clock module receives a second clock signal from a PLL (e.g., PLL 302 in FIG. 3), wherein the PLL outputs a third clock signal to a processor (e.g., processor 108) coupled to the PLL and the multiplexor. The PLL may be coupled to a second power supply different from the first power supply.

At 906, the multiplexor selects the first clock signal to output to the processor based on detecting a droop in voltage on a first power supply (e.g., shared core supply rail 304), wherein the clock module and the processor are coupled to the first power supply. The clock module detects and responds to the droop in the voltage in real-time based on the clock module and the processor being connected to the first power supply.

At 908, the multiplexor selects the third clock signal to output to the processor based on detecting that the droop in the voltage on the first power supply has passed. Based on detecting that the droop in the voltage on the first power supply has passed, the multiplexor selects the third clock signal from the PLL.

Although not illustrated in FIG. 9, the flow may further include detecting a second droop in the voltage on the first power supply, where the second droop in the voltage is in a different frequency spectrum than the first droop in the voltage, and bypassing, by one or more filters coupled to the first power supply, the second droop in the voltage based on the second droop in the voltage being in the different frequency spectrum. In this way, the clock module does not respond to voltage droops in different frequency spectrums.

Figure 10:
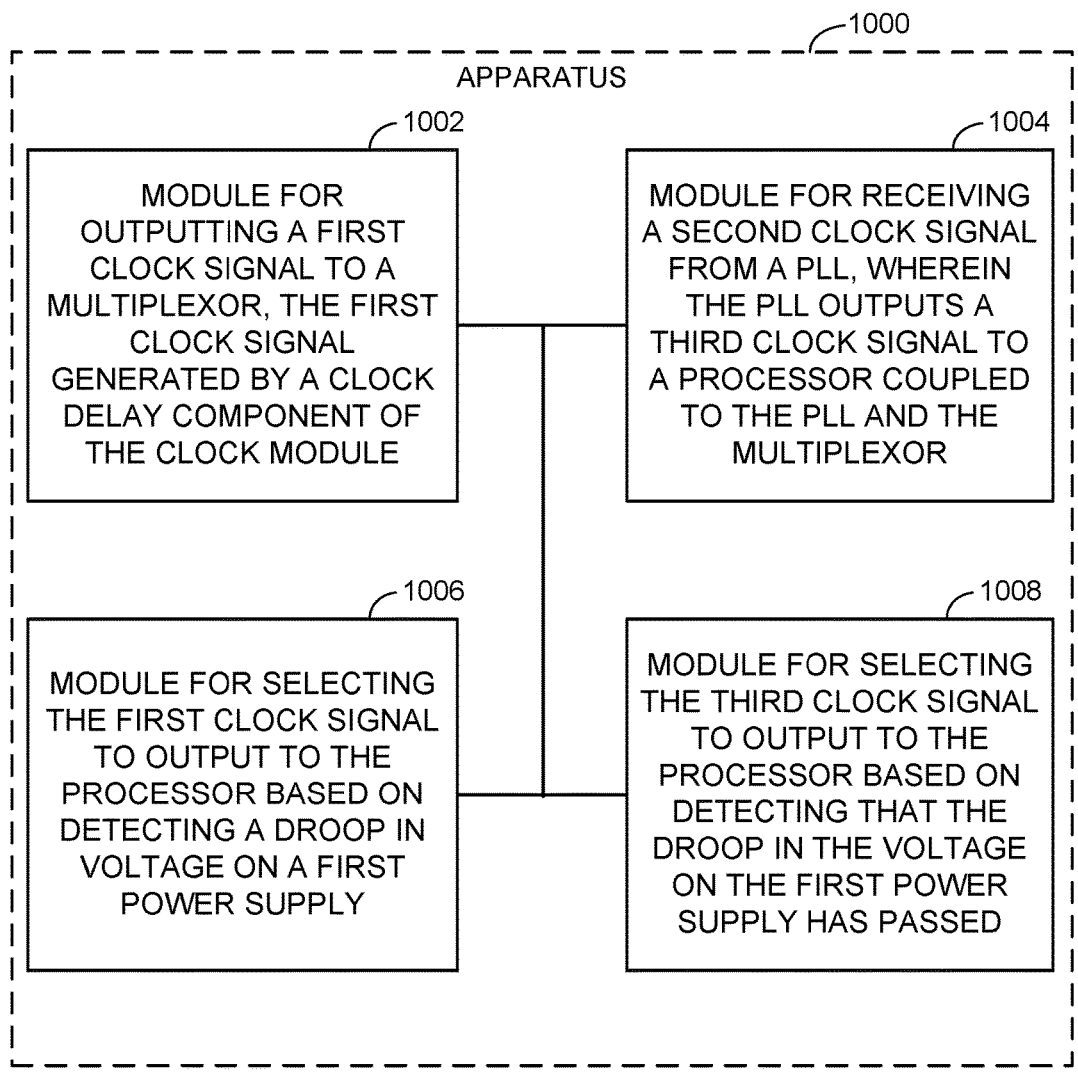
FIG. 10 is a simplified block diagram of several sample aspects of an apparatus configured to support operations as taught herein.

FIG. 10 illustrates an example apparatus 1000 represented as a series of interrelated functional modules. A module for outputting 1002 may correspond at least in some aspects to, for example, a clock module, such as clock 308 in FIG. 3, as discussed herein. A module for receiving 1004 may correspond at least in some aspects to, for example, a clock module, such as clock 308 in FIG. 3, as discussed herein. A module for selecting 1006 may correspond at least in some aspects to, for example, a multiplexor, such as multiplexor 306 in FIG. 3, as discussed herein. A module for selecting 1008 may correspond at least in some aspects to, for example, a multiplexor, such as multiplexor 306 in FIG. 3, as discussed herein.

The functionality of the modules of FIG. 10 may be implemented in various ways consistent with the teachings herein. In some designs, the functionality of these modules may be implemented as one or more electrical components. In some designs, the functionality of these blocks may be implemented as a processing system including one or more processor components. In some designs, the functionality of these modules may be implemented using, for example, at least a portion of one or more integrated circuits (e.g., an ASIC). As discussed herein, an integrated circuit may include a processor, software, other related components, or some combination thereof. Thus, the functionality of different modules may be implemented, for example, as different subsets of an integrated circuit, as different subsets of a set of software modules, or a combination thereof. Also, it will be appreciated that a given subset (e.g., of an integrated circuit and/or of a set of software modules) may provide at least a portion of the functionality for more than one module.

In addition, the components and functions represented by FIG. 10, as well as other components and functions described herein, may be implemented using any suitable means. Such means also may be implemented, at least in part, using corresponding structure as taught herein. For example, the components described above in conjunction with the "module for" components of FIG. 10 also may correspond to similarly designated "means for" functionality. Thus, in some aspects one or more of such means may be implemented using one or more of processor components, integrated circuits, or other suitable structure as taught herein.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a UE.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the disclosure, it should be noted that various changes and modifications could be made herein without departing from the scope of the disclosure as defined by the appended claims. The functions, steps, and/or actions of the method claims in accordance with the embodiments of the disclosure described herein need not be performed in any particular order. Furthermore, although elements of the disclosure may be described or claimed in the singular, the plural is contemplated unless limitation to the singular is explicitly stated.

What is claimed is:

1. An apparatus for mitigating voltage droops, comprising:
   a processor coupled to a first power supply;
   a multiplexor coupled to the processor;
   a clock module coupled to the multiplexor and the first power supply, wherein the clock module includes a clock delay component; and
   a phase-locked loop (PLL) coupled to the multiplexor, wherein a delay of the clock delay component is calibrated to a frequency of the PLL,
   wherein the clock module outputs a first clock signal to the multiplexor and receives a second clock signal from the PLL, the first clock signal generated by the clock delay component,
   wherein the multiplexor is configured to select the first clock signal from the clock module or a third clock signal from the PLL to output to the processor, and
   wherein, based on detection of a first droop in voltage on the first power supply, the multiplexor selects the first clock signal from the clock module to output to the processor.

2. The apparatus of claim 1, wherein the PLL is coupled to a second power supply different from the first power supply.

3. The apparatus of claim 1, wherein the clock delay component comprises a ring oscillator.

4. The apparatus of claim 1, wherein the clock delay component slows down a frequency of the first clock signal in response to detection of the first droop in the voltage on the first power supply.

5. The apparatus of claim 1, wherein the clock delay component includes a plurality of delay elements, and wherein each delay element of the plurality of delay elements, when selected, delays the first clock signal by a delay amount equal to the delay amount of each remaining delay element of the plurality of delay elements.

6. The apparatus of claim 5, wherein a number of the plurality of delay elements selected is based on the second clock signal from the PLL, and wherein the second clock signal is based on a user configuration.

7. The apparatus of claim 1, wherein the clock module detects and responds to the first droop in the voltage in real-time based on the clock module and the processor being connected to the first power supply.

8. The apparatus of claim 1, wherein, based on detection that the first droop in the voltage on the first power supply has passed, the multiplexor selects the third clock signal from the PLL.

9. The apparatus of claim 1, wherein the calibration is performed in real time, at periodic intervals, upon one or more trigger conditions, based on a user triggering a mode change of a user device including the processor, or any combination thereof.

10. The apparatus of claim 9, wherein the user triggering the mode change comprises the user switching a mode of operation of the user device from a first mode to a second mode, wherein the second mode utilizes a lower frequency of the processor than the first mode.

11. The apparatus of claim 1, wherein a second droop in the voltage detected on the first power supply, the second droop in the voltage in a different frequency spectrum than the first droop in the voltage, and
    wherein the first power supply is coupled to one or more filters configured to bypass the second droop in the voltage based on the second droop in the voltage being in the different frequency spectrum.

12. A method of mitigating voltage droops, comprising:
    outputting, by a clock module coupled to a multiplexor, a first clock signal to the multiplexor, the first clock signal generated by a clock delay component of the clock module;
    receiving, by the clock module, a second clock signal from a phase-locked loop (PLL), wherein the PLL outputs a third clock signal to a processor coupled to the PLL and the multiplexor, and wherein a delay of the clock delay component is calibrated to a frequency of the PLL;
    selecting, by the multiplexor, the first clock signal to output to the processor based on detecting a first droop in voltage on a first power supply; and
    selecting, by the multiplexor, the third clock signal to output to the processor based on detecting that the first droop in the voltage on the first power supply has passed,
    wherein the clock module and the processor are coupled to the first power supply.

13. The method of claim 12, wherein the PLL is coupled to a second power supply different from the first power supply.

14. The method of claim 12, wherein the clock delay component comprises a ring oscillator.

15. The method of claim 12, wherein the clock delay component slows down a frequency of the first clock signal in response to detection of the first droop in the voltage on the first power supply.

16. The method of claim 12, wherein the clock delay component includes a plurality of delay elements, and wherein each delay element of the plurality of delay elements, when selected, delays the first clock signal by a delay amount equal to the delay amount of each remaining delay element of the plurality of delay elements.

17. The method of claim 16, wherein a number of the plurality of delay elements selected is based on the second clock signal from the PLL, and wherein the second clock signal is based on a user configuration.

18. The method of claim 12, wherein the clock module detects and responds to the first droop in the voltage in real-time based on the clock module and the processor being connected to the first power supply.

19. The method of claim 12, wherein, based on detecting that the first droop in the voltage on the first power supply has passed, the multiplexor selects the third clock signal from the PLL.

20. The method of claim 12, wherein the calibration is performed in real time, at periodic intervals, upon one or more trigger conditions, based on a user triggering a mode change of a user device including the processor, or any combination thereof.

21. The method of claim 20, wherein the user triggering the mode change comprises the user switching a mode of operation of the user device from a first mode to a second mode, wherein the second mode utilizes a lower frequency of the processor than the first mode.

22. The method of claim 12, further comprising:
   detecting a second droop in the voltage on the first power supply, wherein the second droop in the voltage is in a different frequency spectrum than the first droop in the voltage, and
   bypassing, by one or more filters coupled to the first power supply, the second droop in the voltage based on the second droop in the voltage being in the different frequency spectrum.

23. An apparatus for mitigating voltage droops, comprising:
   a processor means coupled to a first power supply means;
   a multiplexor means coupled to the processor means;
   a clock means coupled to the multiplexor means and the first power supply means, wherein the clock means includes a clock delay component; and
   a phase-locked loop (PLL) coupled to the multiplexor means, wherein a delay of the clock delay component is calibrated to a frequency of the PLL,
   wherein the clock means outputs a first clock signal to the multiplexor means and receives a second clock signal from the PLL, the first clock signal generated by the clock delay component,
   wherein the multiplexor means is configured to select the first clock signal from the clock means or a third clock signal from the PLL to output to the processor means, and
   wherein, based on detection of a droop in voltage on the first power supply means, the multiplexor means selects the first clock signal from the clock means to output to the processor means.

24. The apparatus of claim 23, wherein the PLL is coupled to a second power supply different from the first power supply means.

25. The apparatus of claim 23, wherein the clock means detects and responds to the droop in the voltage in real-time based on the clock means and the processor means being connected to the first power supply.

26. A non-transitory computer-readable medium for mitigating voltage droops, comprising:
   at least one instruction to output, by a clock module coupled to a multiplexor, a first clock signal to the multiplexor, the first clock signal generated by a clock delay component of the clock module;
   at least one instruction to receive, by the clock module, a second clock signal from a phase-locked loop (PLL), wherein the PLL outputs a third clock signal to a processor coupled to the PLL and the multiplexor, and wherein a delay of the clock delay component is calibrated to a frequency of the PLL;
   at least one instruction to select, by the multiplexor, the first clock signal to output to the processor based on detecting a droop in voltage on a first power supply; and
   at least one instruction to select, by the multiplexor, the third clock signal to output to the processor based on detection that the droop in the voltage on the first power supply has passed,
   wherein the clock module and the processor are coupled to the first power supply.

27. The non-transitory computer-readable medium of claim 26, wherein the PLL is coupled to a second power supply different from the first power supply.

28. The non-transitory computer-readable medium of claim 26, wherein the clock module detects and responds to the droop in the voltage in real-time based on the clock module and the processor being connected to the first power supply.

* * * * *